US005530645A

United States Patent [19]
Chu

[11] Patent Number: 5,530,645
[45] Date of Patent: Jun. 25, 1996

[54] COMPOSITE DICTIONARY COMPRESSION SYSTEM

[75] Inventor: Ke-Chiang Chu, Saratoga, Calif.

[73] Assignee: Apple Computer, Inc., Cupertino, Calif.

[21] Appl. No.: 85,846

[22] Filed: Jun. 30, 1993

[51] Int. Cl.⁶ ............................ G05B 19/04; G06F 13/00
[52] U.S. Cl. ................................ 364/419.13; 364/419.1; 364/419.11; 364/419.14; 341/51; 341/55; 341/79; 341/106; 382/232
[58] Field of Search ...................... 364/419.14, 419.11, 364/419.1; 341/51, 55, 79, 106; 382/56

[56] References Cited

U.S. PATENT DOCUMENTS

| | | | |
|---|---|---|---|
| 4,588,302 | 12/1985 | Welch | 340/347 |
| 4,843,389 | 6/1989 | Lisle et al. | 341/106 |
| 4,876,541 | 10/1989 | Storer | 341/51 |
| 4,881,075 | 11/1989 | Weng | 341/87 |
| 5,016,009 | 5/1991 | Whiting et al. | 341/67 |
| 5,109,433 | 4/1992 | Notenboom | 382/40 |
| 5,155,484 | 10/1992 | Chambers IV | 341/55 |
| 5,175,543 | 12/1992 | Lantz | 341/51 |
| 5,179,378 | 3/1993 | Ranganathan et al. | 341/51 |
| 5,243,341 | 9/1993 | Seroussi et al. | 341/51 |
| 5,298,895 | 3/1994 | Van Marren | 341/51 |
| 5,323,155 | 6/1994 | Iyer et al. | 341/51 |
| 5,333,313 | 7/1994 | Heising | 395/600 |
| 5,373,290 | 12/1994 | Lemple et al. | 341/51 |
| 5,389,922 | 2/1995 | Seroussi et al. | 341/51 |
| 5,410,671 | 4/1995 | Elgamal et al. | 395/425 |
| 5,442,350 | 8/1995 | Iyer et al. | 341/51 |
| 5,455,576 | 10/1995 | Clark, II et al. | 341/50 |

OTHER PUBLICATIONS

IEEE Computer, Jun. 1984, pp. 8–19, Terry A. Welch, Sperry Research Center, "A Technique for High–Performance Data Compression.".
IEEE, Transactions on Information Theory, vol. II 23. No. 3, May 1977, pp. 337–343 J. Ziv, A. Lempel, "A Universal Algorithm for Sequential Data Compression.".
IEEE, Transactions on Information Theory, vol. II 24, No. 5, Sep. 1978, pp. 530–536, J. Ziv, A. Lempel, "Compression of Individual Sequences via Variable–Rate Coding.".
IEEE Transactions on Information Theory vol. II, 21, No. 2, Mar. 1975, pp. 194–203. Peter Elias, "Universal Codeword Sets and Representations of the Integers.".
Communications of the ACM, Apr. 1989 vol. 32 No. 4, pp. 490–504, Edward R. Riala and Daniel H. Greene, "Data Compression with Finite Windows.".
Timothy C. Bell, John G. Cleary, Ian H. Witten, *Text Compression*, Prentice Hall, Englewood Cliffs, New Jersey, 1990, pp. 206–243.

*Primary Examiner*—Gail O. Hayes
*Assistant Examiner*—Felicia Ives
*Attorney, Agent, or Firm*—V. Randall Gard

[57] ABSTRACT

A composite dictionary data compression process for use with a computer system comprising the steps of: receiving into the computer system an uncompressed input data string; searching a composite dictionary to detect for a dictionary data string matching the uncompressed input data string, the composite dictionary comprising a fixed dictionary and an adaptive dictionary; and modifying the adaptive dictionary in response to whether a matching dictionary data string is detected.

18 Claims, 5 Drawing Sheets

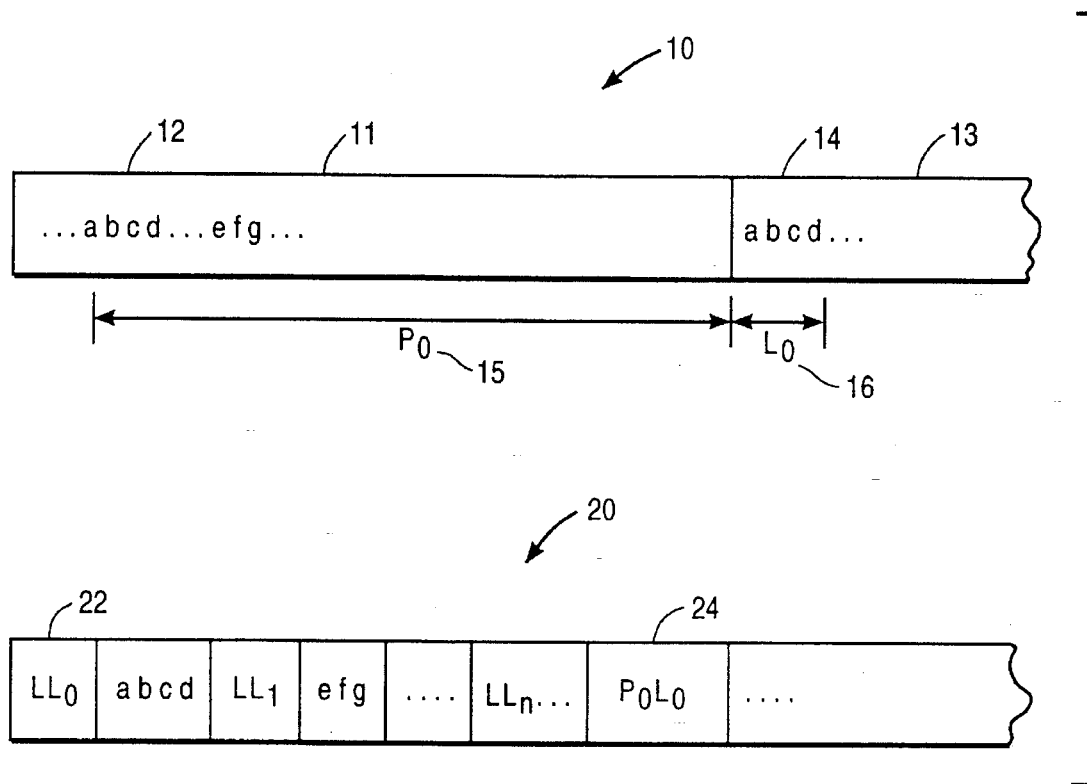
FIG. 1 (PRIOR ART)
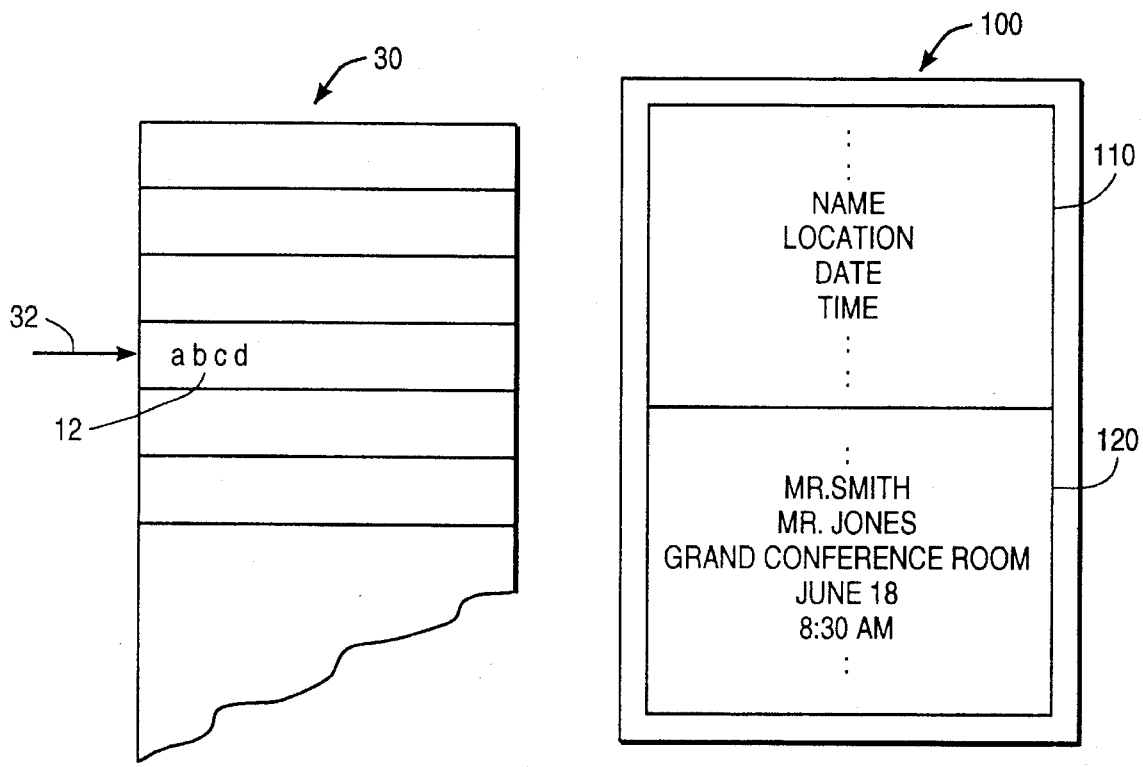
FIG. 2 (PRIOR ART)
FIG. 3

COMPOSITE DICTIONARY COMPRESSION SYSTEM

FIELD OF INVENTION

This invention relates to electronic data compression systems. More specifically, this invention relates to data compression systems involving adaptive or fixed dictionaries.

BACKGROUND

Dictionary type data compression method is well known in the art of electronic data compression and are also commonly referred to as a "codebook" or a "macro coding" approach. The various coding schemes in the Ziv-Lempel CLZ") family of data compression techniques are all examples of the dictionary type of data coding method. FIGS. 1 and 2 illustrates two well known LZ family of data compression techniques. FIG. 1 is an example of an LZ-1 compression method using a history buffer 11 to compress an input data stream. A typical LZ-1 data compression method processes an input data stream 10 to generate a compressed data stream 20 by comparing current literal string 13 from input data stream 10 to data in a history buffer 11. If a corresponding data string 12 is located in history buffer 11, a pointer and length $(p_o, l_o)$ 24 is then encoded into output data buffer 20, wherein $p_o$ compounds to offset 15, associated with the memory location of matching data string 12, and $l_o$ corresponds to a data length 16. Pointer $(p_o, l_o)$ 24 requires less memory to store in output compressed data stream 20 than the literal of data string 14. In the LZ-2 type data compression technique as illustrated in FIG. 2, the LZ-2 data compression process searches for a data string in a table 30 that matches current input data string 14. If dictionary string 12 is detected, literal string 14 is then encoded in the output data stream by means of index $i_o$ and length $l_o$, such as $(i, l_o)$ 32, which points to the corresponding location of matching dictionary string 12 in dictionary 30.

Both LZ-1 or LZ-2 type compression technique can be designed to be either fixed or adaptive dictionary compression methods. In a fixed dictionary compression method, the "dictionary" (e.g., dictionary buffer 11 in the case of an LZ-1 fixed dictionary method, or table 30 in the case of an LZ-2 fixed dictionary method) typically comprises a set of fixed data entries, which is first loaded into the computer system's memory before compressing the input data stream. In an adaptive dictionary compression method, the "dictionary" (e.g., history buffer 11 or table 30) is modified to store new data strings into the dictionary during data compression process, if no matching data string is detected in the already stored data strings of the adaptive dictionary.

A fixed dictionary compression method provides efficient and good data compression performance when the set of input data in the input data stream correlates to the data entries in the fixed dictionary. However, where the input data stream comprises data that varies widely from one set of input data to another, the data compression performance of a fixed dictionary compression method typically decreases since the set of data entries in a fixed dictionary cannot be modified to accommodate such widely varying range of input data possibilities and the fixed dictionary is also typically limited by its memory allocation. An adaptive dictionary method provides the flexibility lacking in a fixed dictionary to accommodate a wide variety of input data. However, an adaptive dictionary method does not provide efficient data compression on small input data files, since an adaptive dictionary method typically does not begin to provide efficient compression performance until after having process about 1000 bytes of the input data stream.

It would therefore be desirable to provide an efficient data compression method that provides efficient data compression for data files generated by known software applications with a small file size, such as a file size of less than 1000 bytes of data.

SUMMARY OF THE INVENTION

A composite dictionary data compression system described in accordance with the principles of this invention provides a composite dictionary comprising a fixed dictionary of application-dependent data and an adaptive dictionary of user-dependent data for compressing an input data stream. The composite data compression process described in accordance with the principles of this invention for use with a computer system comprises the steps of: receiving into the computer system an uncompressed input data string; searching a composite dictionary to detect for a dictionary data string matching the uncompressed input data string, wherein the composite dictionary comprises a fixed dictionary and an adaptive dictionary; and modifying the adaptive dictionary in response to whether a matching dictionary data string is detected. The composite dictionary data compression process thus provides better data compression performance for small data files, or at the beginning of data compression process of a data file, while still providing the flexibility of an adaptive dictionary.

BRIEF DESCRIPTION OF DRAWINGS

FIG. 1 illustrates a prior art data compression method using a history buffer;

FIG. 2 illustrates a prior an dictionary data compression method;

FIG. 3 illustrates a block diagram of a composite dictionary system provided in accordance with the principles of this invention;

DETAILED DESCRIPTION

Data associated with a particular application can be classified either as application-dependent data, such as data associated with a particular software application, or as user-dependent data, such as data provided by the user of such software application. FIG. 3 illustrates a block diagram of a composite dictionary 100 provided in accordance with the principles of this invention. Composite dictionary 100 comprises a fixed dictionary 110 of a set of predefined application-dependent data and an adaptive dictionary 120 of user-dependent data. Fixed dictionary 110 comprises a set of predefined dictionary data entries comprising application-dependent type of data. For example, in a software application for scheduling meetings, application-dependent type data might comprise data strings such as "name" "location," "date," "time," and other such common data words that are associated with that software application. Adaptive dictionary 120 comprises modifiable and user-dependent type data that the user provides during the execution of that application, such as names of attendees, the name of a conference room, the date of a particular meeting, the time of a particular meeting, and other such user provided information. The application, the application-dependent data, and the user-dependent data described with FIG. 3 is merely an example to illustrate composite dictionary 100. It is envisioned that the composite dictionary 100 described in accordance with the principles of this invention may be applicable to other software applications, its corresponding application-dependent type data, and user-dependent data Thus, to compress a block of input data using composite dictionary 100, either an LZ-1 or LZ-2 type data compression technique may be used to search fixed dictionary 110 and adaptive dictionary 120 to detect for a dictionary entry that matches the current input data string.

Figure 4:
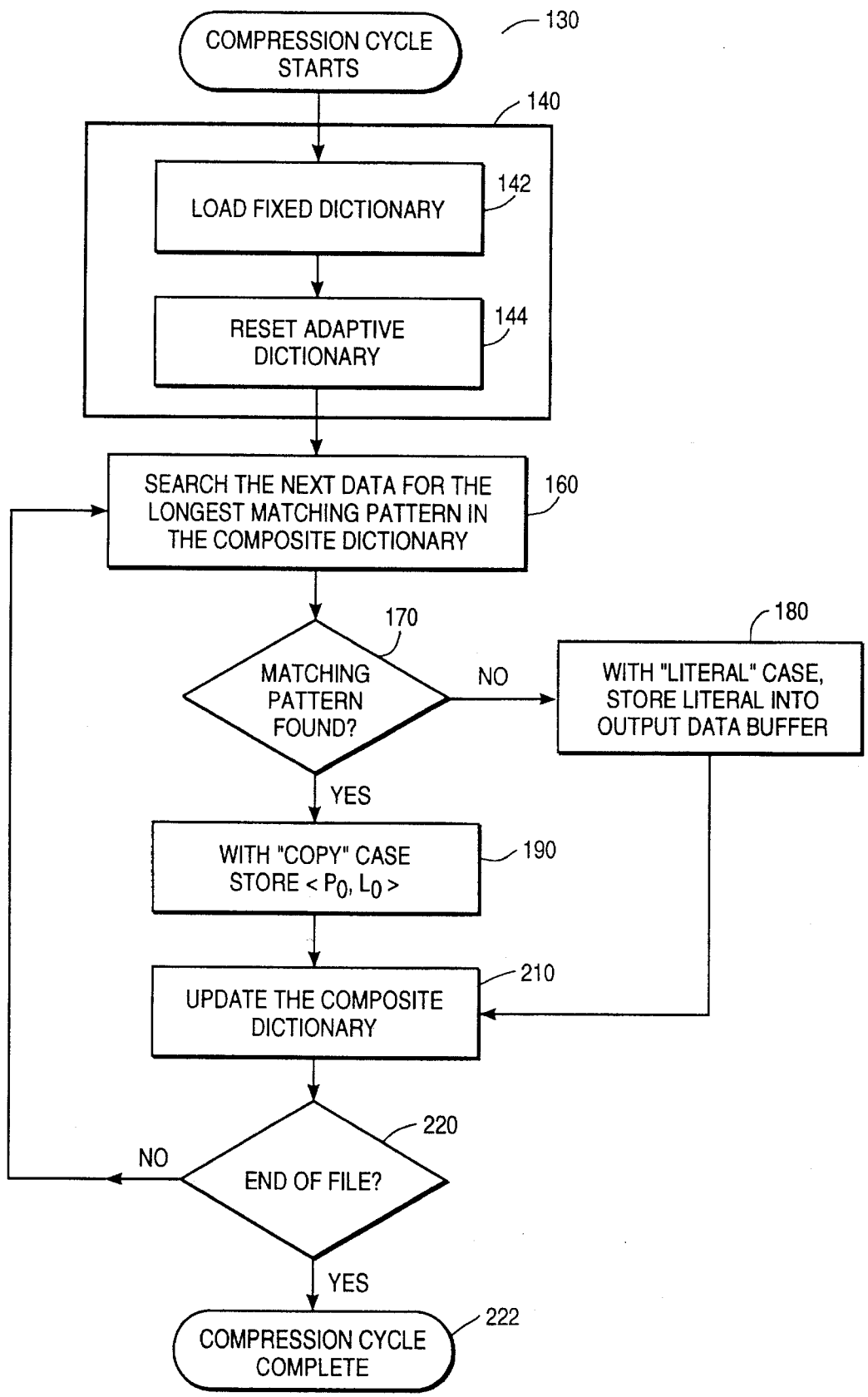
FIG. 4 illustrates a block diagram of a composite dictionary data compression process provided in accordance with the principles of this invention.

FIG. 4 illustrates an example of a detailed block diagram of the composite dictionary data compression process 130 provided in accordance with the principles of this invention. Composite dictionary data compression process 130 comprises first initializing in step 140 a composite dictionary, such as composite dictionary 100 illustrated in FIG. 3. In the preferred embodiment, initializing the composite dictionary comprises loading the fixed dictionary (such as fixed dictionary 110 shown in FIG. 3) with a set of predefined data entries that are associated with the particular software application requiring data compression, and resetting the adaptive dictionary (such as adaptive dictionary 120 shown in FIG. 3) to clear all entries in the adaptive dictionary. Following initialization step 140, data compression process 130 then searches in step 160 through composite dictionary 100 to detect a dictionary data string matching the current uncompressed input data string in the input data buffer (not shown). In searching step 160, either LZ-1 or LZ-2 compression methods can be used to search both the fixed dictionary and the adaptive dictionary.

In step 170, if a matching dictionary data string is detected in composite dictionary 100 (a "copy" case), composite dictionary process 130 then, in step 190, stores the memory locator, such as pointer (po, lo), associated with that detected dictionary data string into an output compressed data buffer. Compression process 130 then, in step 210, updates composite dictionary 100. However, if a matching dictionary data string is not detected in step 170, compression process 130 in step 180 stores the literal in the current input data string into the output compressed data buffer (a "literal" case), and then compression process 130 updates composite dictionary 100 in step 210. Following step 210 of updating composite dictionary 100, composite dictionary compression process 130 then checks in step 220 to detect whether the input uncompressed data buffer is at "End of File" ("EOF.") If the input uncompressed data buffer is at EOF, then terminating further data compression. If the input uncompressed data buffer is not at EOF, then returning compression process 130 back to step 160 to continue data compression of the next input data string in the input data buffer.

Figure 5:
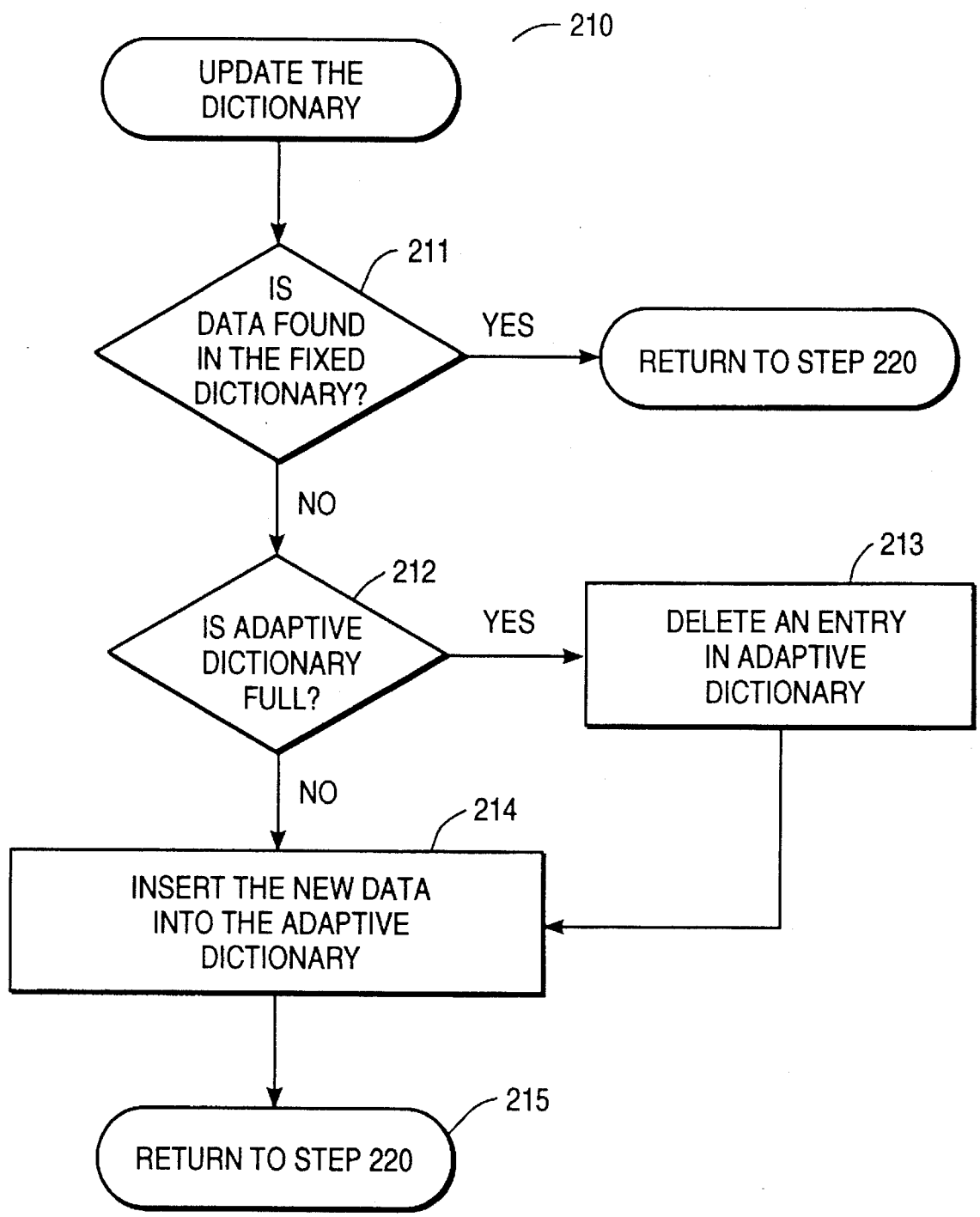
FIG. 5 illustrates a more detailed block diagram of a dictionary updating process of the data compression process shown in FIG. 4 in accordance with the principles of this invention.

FIG. 5 illustrates a more detailed embodiment of updating dictionary step 210 of compression process 130. Initially, updating dictionary step further comprises step 211 of determining whether the detected matching dictionary string found in step 170 (FIG. 4) is located in the fixed dictionary section of the composite dictionary or in the adaptive dictionary section. If the detected matching dictionary string is determined to be in the fixed dictionary, then updating dictionary process 210 returns to step 220 of compression process 130. If, however, the detected matching dictionary string is determined to be in the adaptive dictionary, then updating dictionary process 210 next checks, in step 212, to detect whether the adaptive dictionary is already full of data entries. If the adaptive dictionary is not full of entries, the literal in the current input data string is added as a new dictionary entry to the adaptive dictionary in step 214. If the adaptive dictionary is full, then, in step 213, updating dictionary process 210 removes one or more entries in the adaptive dictionary in accordance with any one of a variety of methods of modifying dictionary entries, such as in accordance with the least recent use ("LRU") method, the "FLUSH" method, the "FREEZE" method, or other such known methods of modifying dictionary entries. After one or more additional dictionary entries have been deleted, updating dictionary step 210 then inserts in step 214 the literal string of the current input data into the adaptive dictionary and updates dictionary process 210 returns back to step 220 (FIG. 4).

Figure 6:
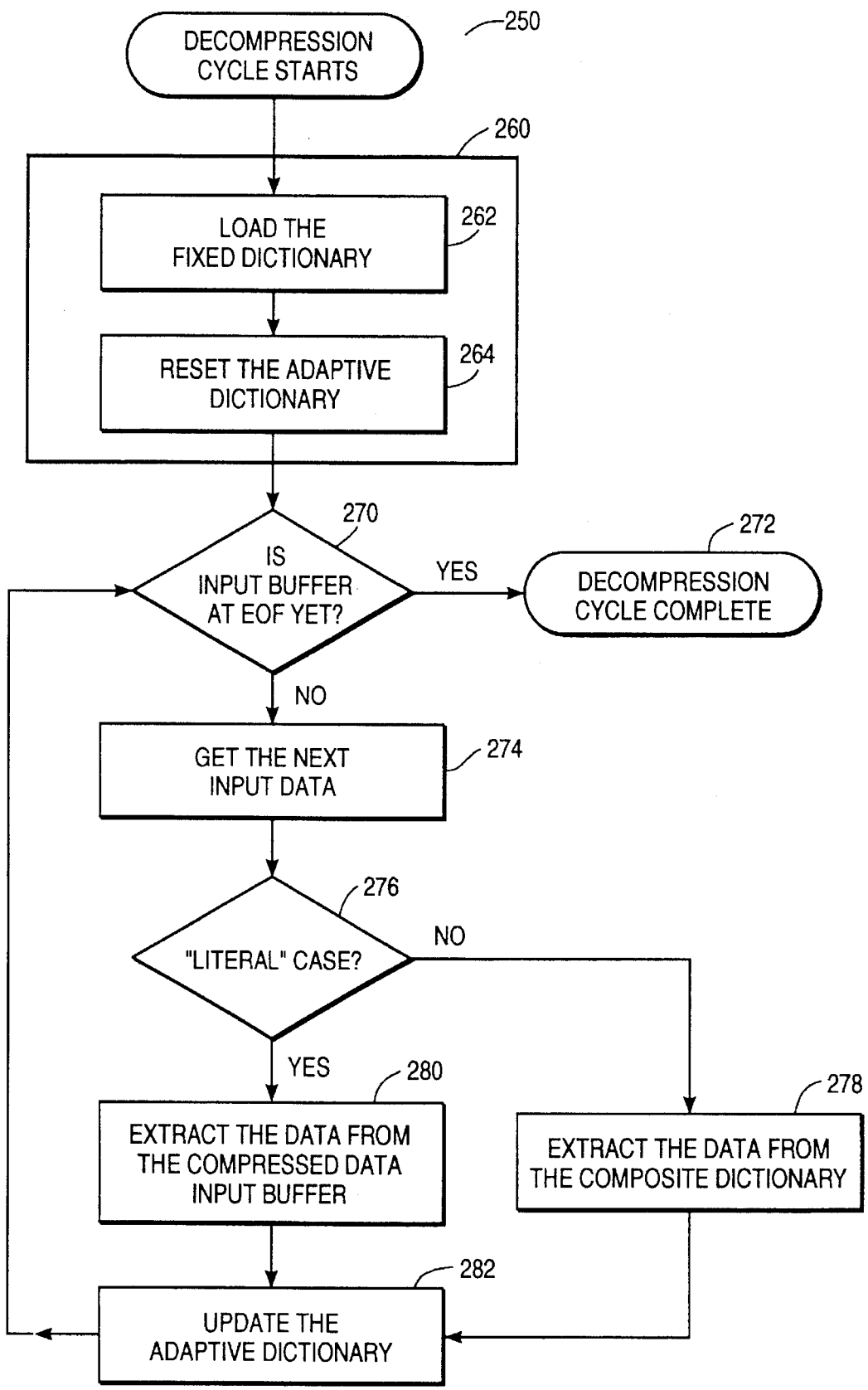
FIG. 6 illustrates a block diagram of a decompression process of the data compression process shown in FIG. 4 in accordance with the principles of this invention.

In the preferred embodiment, compression process 130 further comprises a decompression process 250 as shown in FIG. 6. During decompression of the current compressed input data, decompression process 250 first initiates the composite dictionary in step 260. In the preferred embodiment, initiating step 260 comprises loading the fixed dictionary with its predefined dictionary entries and resetting the adaptive dictionary of the composite dictionary. After initiating the composite dictionary, decompression process 250 then checks the input data buffer comprising compressed input data to detect in step 270 whether the compressed input data buffer is at "end of file" ("EOF"). If the compressed input data buffer is at EOF, then decompression process 250 terminates further data decompression in step 272. If, however, a compressed input data is detected in the input data buffer, decompression process 250 then fetches in step 274 this next input data from the input data buffer as the current input data to decompress. Decompression process 250 checks in step 276 whether current input data comprises a literal string or data already stored in the composite dictionary. If a literal string is detected in current input data, decompression process 250 then in step 280 extracts the literal stored in the input data and updates the composite dictionary in step 282. If, however, the current input data does not comprise a literal string, then decompression process 250 in step 278 extracts from the composite dictionary the detected dictionary string by means of its associated pointer ($p_o$, $l_o$), or its associated index ($i_o$, $l_o$), and stores the extracted dictionary string in a decompressed data output buffer. The decompression process 250 then updates the composite dictionary in step 282.

Figure 7:
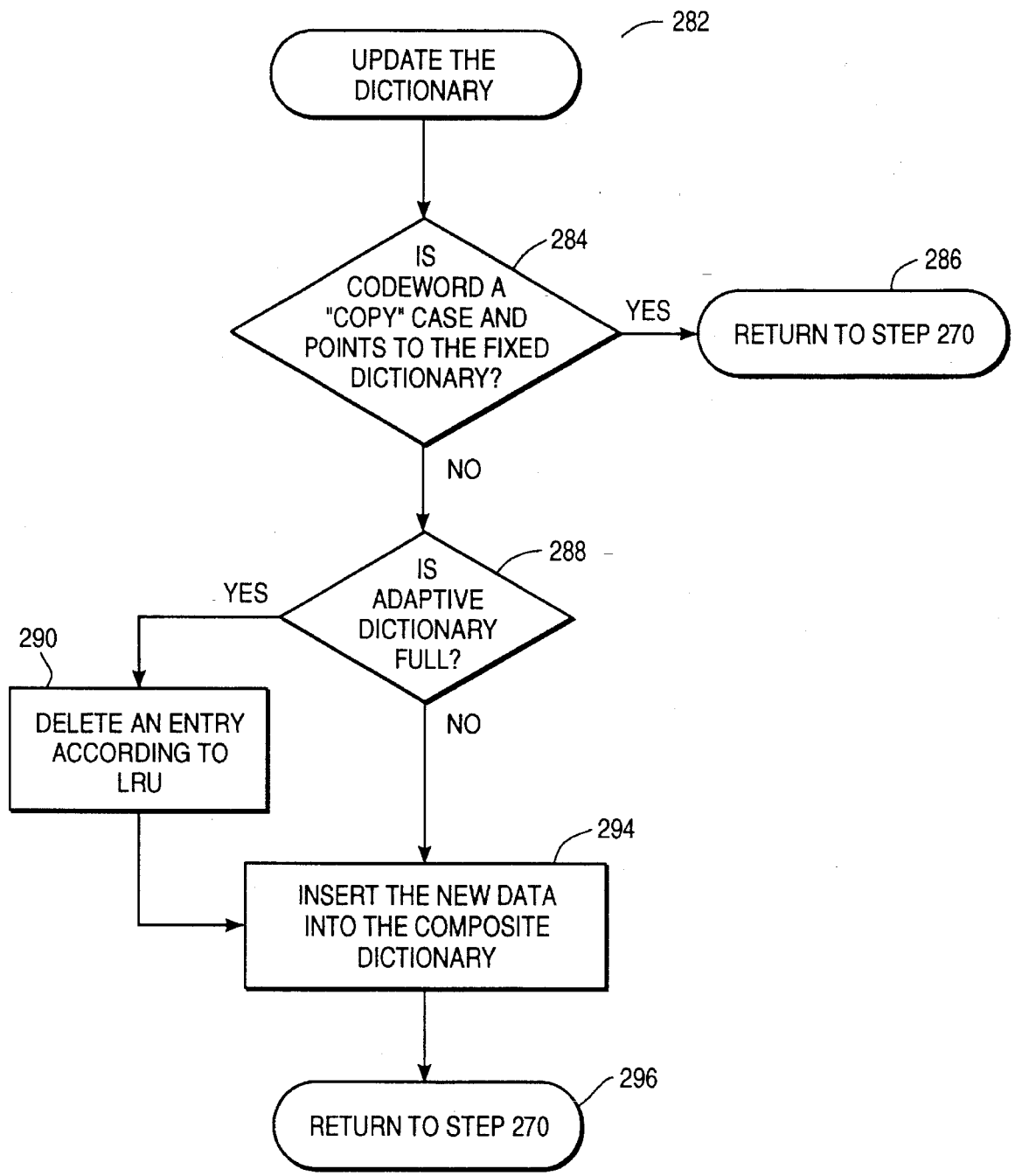
FIG. 7 illustrates a more detailed block diagram of the dictionary updating process of the data decompression process shown in FIG. 6.

FIG. 7 illustrates a more detailed embodiment of decompression, updating dictionary step 282. In step 282, updating dictionary process 282 first checks in step 284 to detect if the associated dictionary data extracted from the composite dictionary comprises data from the fixed dictionary or the adaptive dictionary. If the associated dictionary string is detected as from the fixed dictionary (e.g., "copy" case), then updating dictionary step 282 returns back to step 270 to continue data decompression process 250. If, however, the associated dictionary data is not detected as from the fixed dictionary, then updating process 282 in step 288 checks to detect whether the adaptive dictionary is already full in step 288. If the adaptive dictionary is not full then, updating dictionary process 282 inserts the new data entry into the composite dictionary, and returns to step 270 of decompression process 250 (FIG. 6). If, however, the adaptive dictionary of the composite dictionary is detected as already full, then in step 290, updating dictionary process 282 modifies the adaptive dictionary in a manner according to any of the known dictionary modification methods, such as the "LRU" method, the "Flush" method, the "FREEZE" method, or other such known dictionary modification methods. Once one or more dictionary entries have been deleted, updating dictionary process 282 then adds the associated dictionary data into the adaptive dictionary and returns data decompression process 250 back to step 270 (FIG. 6).

Compression process 130 thus provides an improved compression and decompression process for small application data files by providing both a fixed dictionary to increase compression performance for application-dependent type data contained in those small data files, and an adaptive dictionary to provide the flexibility needed for the user-dependent type data in those data files.

Having described an embodiment of this invention, it is understood that changes can be made to this embodiment by one of ordinary skill in the art while not deviating from the spirit and scope of this invention.

I claim:

1. A composite dictionary data compression process for use with a computer system comprising the steps of:

receiving into the computer system an uncompressed input data string;

searching a composite dictionary to detect a dictionary data string matching the uncompressed input data string, the composite dictionary comprising a fixed dictionary and an adaptive dictionary; and modifying the adaptive dictionary in response to whether a matching dictionary data string is detected.

2. A composite dictionary data compression process of claim 1 wherein the step of modifying the adaptive dictionary further comprises adding a new dictionary entry to the adaptive dictionary if a matching dictionary data string is not detected in the composite dictionary.

3. A composite dictionary data compression process of claim 2, wherein if a matching dictionary data string is not detected, the uncompressed input data string is inserted into an output data buffer as a literal string.

4. A composite dictionary data compression process of claim 2, wherein if a matching dictionary data string is detected, a corresponding address locator is inserted into an output data buffer.

5. A composite dictionary data compression process of claim 1 further comprising a decompression process, the decompression process comprising the steps of:

loading the computer system with the fixed dictionary;

initializing the adaptive dictionary;

detecting a compressed input data entry to decompress in a compressed input data buffer;

detecting if the compressed input data entry corresponds to stored data in the composite dictionary, and if the compressed input data entry is detected to correspond to stored data in the composite dictionary, then retrieving the stored data from the composite dictionary.

6. A composite dictionary data compression process of claim 5 wherein the step of retrieving the stored data from the composite dictionary further comprises using the compressed data entry as an address locator to find the stored data in the composite dictionary.

7. A composite dictionary data compression process of claim 5 wherein in response to detecting that the compressed data entry does not correspond to stored data from the composite dictionary, then the decompression process further comprises copying a literal data string from the compressed input data buffer to a decompressed output data buffer.

8. A composite dictionary data compression process of claim 7 further comprising the step of updating the composite dictionary in response to detecting that the compressed data entry does not correspond to stored data from the composite dictionary.

9. A composite dictionary data compression process of claim 8 wherein the step of updating the composite dictionary further comprises copying the literal data string from the compressed input data buffer to the composite dictionary.

10. A composite dictionary data compression process for use with a computer system, the compression process comprising the steps of:

initiating a composite dictionary, the composite dictionary comprising a fixed dictionary and an adaptive dictionary, wherein the step of initiating the composite dictionary comprises loading the fixed dictionary with a set of predefined data entries and resetting the adaptive dictionary;

receiving into the computer system an uncompressed input data string;

searching the composite dictionary to detect a dictionary data string matching the uncompressed input data string; and modifying the composite dictionary in response to whether a matching dictionary data string is detected.

11. A composite dictionary data compression process of claim 10 wherein modifying the composite dictionary further comprises: creating a dictionary entry in the adaptive dictionary for the uncompressed input data string in response to not detecting a matching data string in the composite dictionary.

12. A composite dictionary data compression process of claim 10 further comprising a composite dictionary data decompression process, the data decompression process comprising the steps of:

loading a plurality of application dependent dictionary entries into the fixed dictionary;

resetting the adaptive dictionary;

detecting whether an input data buffer contains at least one compressed input data entry;

decompressing the contents of the input data buffer in response to detecting a compressed input data entry.

13. A composite dictionary data compression process of claim 12 wherein the step of decompressing further comprises:

detecting whether the compressed input data entry comprises a literal data string;

wherein in response to not detecting a literal data string, then retrieving a matching dictionary data string from the composite dictionary, and wherein in response to detecting a literal data string, then storing the literal data string into the decompressed data output buffer.

14. A composite dictionary data compression process of claim 13 further comprising updating the composite dictionary in response to detecting the literal data string.

15. A composite dictionary data compression process of claim 14 wherein the step of updating the composite dictionary in response to detecting the literal data string further comprises:

detecting whether the adaptive dictionary is full;

wherein if the adaptive dictionary is not full, then storing the literal data string in the adaptive dictionary.

16. A composite dictionary data compression of claim 15 wherein if the adaptive dictionary is full, then replacing an old dictionary entry from the adaptive dictionary with the literal data string.

17. A method for compressing data in a computer system, the method comprising the steps of:

retrieving a plurality of stored dictionary entries into a fixed dictionary;

performing the following steps for each input data string in a stream of input data strings:

searching a composite dictionary for a dictionary entry that matches the input data string, the composite dictionary comprising the fixed dictionary and an adaptive dictionary;

if a dictionary entry that corresponds to the input data string is found, then transmitting an address locator that identifies the dictionary entry that corresponds to the input data string;

if a dictionary entry that corresponds to the input data string is not found, then transmitting the input data string as a literal string; and adding a dictionary entry that corresponds to the input data string to the adaptive dictionary.

18. The method for compressing data of claim 17 wherein said step of retrieving a plurality of stored dictionary entries comprises retrieving a plurality of stored dictionary entries that are associated with a particular software application.

\* \* \* \* \*